(12) United States Patent
Waldrop et al.

(10) Patent No.: US 11,417,374 B1
(45) Date of Patent: Aug. 16, 2022

(54) RESET SPEED MODULATION CIRCUITRY FOR A DECISION FEEDBACK EQUALIZER OF A MEMORY DEVICE

(71) Applicant: Micron Technology, Inc., Boise, ID (US)

(72) Inventors: William Chad Waldrop, Allen, TX (US); Gary L. Howe, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 13 days.

(21) Appl. No.: 17/178,475

(22) Filed: Feb. 18, 2021

(51) Int. Cl.
*G11C 7/10* (2006.01)
*G11C 11/4093* (2006.01)
*G11C 11/4076* (2006.01)

(52) U.S. Cl.
CPC .......... *G11C 7/1084* (2013.01); *G11C 7/1006* (2013.01); *G11C 11/4076* (2013.01); *G11C 11/4093* (2013.01)

(58) Field of Classification Search
CPC ... G11C 7/1084; G11C 7/1006; G11C 7/4076; G11C 7/4093
See application file for complete search history.

(56) References Cited

U.S. PATENT DOCUMENTS

| | | | |
|---|---|---|---|
| 2009/0175328 A1* | 7/2009 | Kim | G11C 27/02 375/233 |
| 2013/0107935 A1* | 5/2013 | Zhou | H04L 25/03248 375/317 |
| 2018/0294999 A1* | 10/2018 | Giovannini | G11C 19/00 |

* cited by examiner

*Primary Examiner* — Connie C Yoha
(74) *Attorney, Agent, or Firm* — Fletcher Yoder, P.C.

(57) ABSTRACT

Systems and methods described herein provide decision feedback equalizer (DFE) circuitry that includes one or more phases. The one or more phases receive bit feedback at respective inputs of the phases. The DFE circuitry also may include variable reset circuitry. The variable reset circuitry may reset voltages of the bit feedback at inputs of each of the phases. The variable reset circuitry is configured to change its reset frequency between resets.

20 Claims, 7 Drawing Sheets

RESET SPEED MODULATION CIRCUITRY FOR A DECISION FEEDBACK EQUALIZER OF A MEMORY DEVICE

BACKGROUND

Field of the Present Disclosure

Embodiments of the present disclosure relate generally to the field of decision feedback equalizers (DFEs) for memory devices. More specifically, embodiments of the present disclosure relate to modulating the speed of resetting the phases of the DFE using a DFE reset generator.

Description of Related Art

Semiconductor devices (e.g., memory devices) utilize timing with phase shifts of data signals, data strobes, and/or other signals to perform operations (e.g., write operations, read operations, refresh operations). A DFE may be used to maintain a buffer of a number (e.g., 4) of preceding data bits to improve accuracy in interpreting whether a current bit is high or low. Sometimes a bit being transmitted through a receiver is affected by interferences caused by previous bit transmission (referred to as inter-symbol interference (ISI)). A DFE may use bit feedback from different bit transmission to reduce these interferences. For example, if the DFE stores previous low data bits, then a data line (DQ) may use a lower voltage level when latching a next bit transmission based on the values stored in the DFE, and the current data bit is to be interpreted as a logical high or a low relative to the lower voltage level. Sometimes data stored in the DFE is to be reset between sequential data bursts, such as between write commands or read commands as to not use incorrect or outdated data values from a previous data transaction for a future correction operation. However, a DFE reset operation is to be completed after a first data burst completes and before a second data burst arrives at the DFE. For at least this reason, the DFE reset operation is generally designed to be as fast as possible and reset signals may compete with the beginning of a subsequent write burst.

Indeed, as frequency of operations within memory devices change, DFE reset generators may no longer generate reset signals compatible with transmission times of sequential commands. For example, at slower frequencies, a DFE reset operation may prematurely reset a data feedback before the data feedback was able to be used to correct for inter-symbol interference (ISI), as will be appreciated. Additional issues may persist with deployments of DFE resets, such as undesired drift (e.g., advancing or delaying) of reset periods over time and/or difficulty maintaining timing parameters associated with DFE operation. Indeed, these conditions may make it more difficult to maintain a DFE reset that is fast enough to handle the case where there is a one-period gap in toggling of a data clock strobe (DQS) but not so fast that the DFE reset prematurely clears data feedback (e.g., fed back bits) to be latched. Embodiments of the present disclosure may be directed to one or more of the problems set forth above.

BRIEF DESCRIPTION OF DRAWINGS

Various aspects of this disclosure may be better understood upon reading the following detailed description and upon reference to the drawings in which.

DETAILED DESCRIPTION

Figure 1:
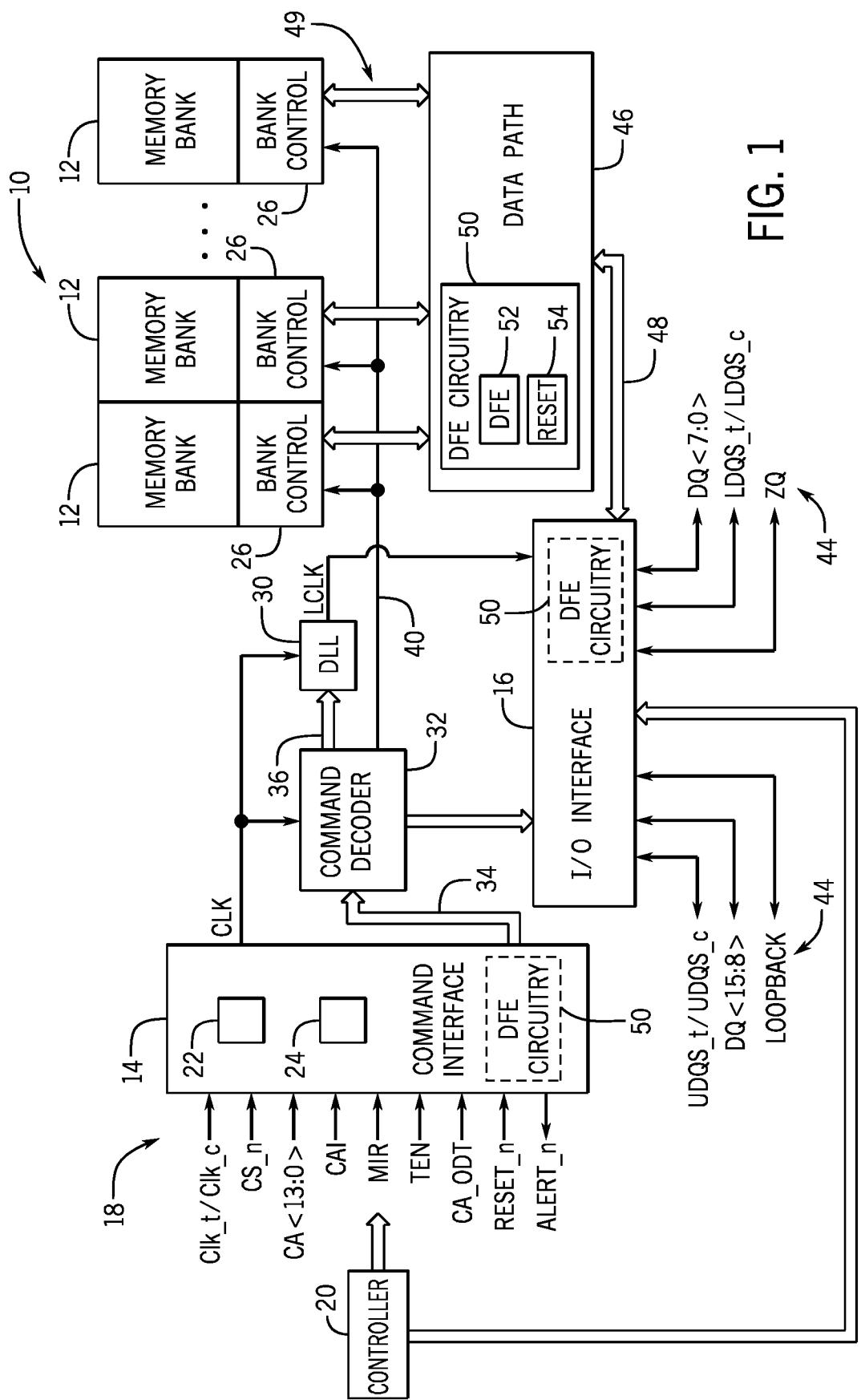
FIG. 1 is a simplified block diagram illustrating certain features of a memory device having decision feedback equalizer (DFE) circuitry that includes a DFE that determines a level for data received by the memory device and includes DFE reset circuitry, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

A decision feedback equalizer (DFE) may utilize one or more phases to track previous data levels to interpret incoming data levels. Between data bursts associated with memory transactions, such as read or write operations, one or more input buffers and/or other circuitry of the phases may be reset to an initial state (e.g., all high or low values) using DFE reset circuitry. However, as transaction rates (e.g., transaction speeds) increase for memory operations, the period of time between sequential operations decreases, leaving less time during which to perform the reset operation. This may increase a likelihood of a DFE reset operation partially continuing (e.g., being partially ongoing) during a next write operation. This can cause inaccuracies with the DFE reset operations due to premature or untimely resets occurring to the phases and/or taps, which may misrepresent signals latched to correct inter-symbol interferences. In other words, the DFE reset may be desired to occur fast enough to complete a full reset of each of the DFE taps or inputs of a phase for a fastest data rate of a memory but slow enough for a slowest data rate of the memory so the DFE reset does not occur for a respective phase before the history of the respective DFE tap is used by the respective phase to compensate for ISI. This constraint may be further limited since sometimes it is desired that a DFE reset occurs in the shortest amount of time and with the smallest amount of gap between bursts. Using a single timing for a DFE reset operation meeting these criteria may merely work for data rates similar to each other, and the larger a difference between a slowest data rate and a highest data rate for the memory, the harder it is to find a DFE reset timing that works for both data rates. Indeed, a DFE reset having variable timing may enable suitable operation at a variety of operational frequencies regardless of relative data rate differences between the operational frequencies.

As described herein, the DFE reset circuitry may receive control signals and/or may access a data rate register and use information stored in the data rate register to adjust a rate used to generate reset timing signals. Having access to the data rate register permits the DFE reset circuitry to adjust reset rates with memory transaction rates, therefore reducing a likelihood of a DFE reset overlapping with a previous transaction and increasing a likelihood that the reset operations satisfy other timing constraints.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a Double Data Rate 5 (DDR5) Synchronous Dynamic Random-Access Memory (SDRAM) device. Various features of DDR5 SDRAM allow for reduced power consumption, more bandwidth and more storage capacity compared to prior generations of Double Data Rate (DDR) SDRAM.

The memory device 10 may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMs). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (110) interface 16. The command interface 14 is configured to provide a number of signals (e.g., signals 18) from an external device, such as a controller 20. The controller 20 may provide various signals 18 (including the DQ signals) to the memory device 10 to facilitate the transmission and receipt of data to be written to or read from the memory device 10.

As will be appreciated, the command interface 14 may include a number of circuits, such as clock input circuitry 22 and command address input circuitry 24, for instance, to ensure proper handling of the signals 18. The command interface 14 may receive one or more clock signals from an external device. Generally, double data rate (DDR) memory utilizes a differential pair of system clock signals, referred to herein as the true clock signal (Clk_t) and the bar or complimentary clock signal (Clk_c). The positive clock edge for DDR refers to the point where the rising true clock signal Clk_t crosses the falling complimentary clock signal Clk_c, while the negative clock edge indicates that transition of the falling true clock signal Clk_t and the rising of the complimentary clock signal Clk_c. Commands (e.g., read command, write command, etc.) are typically entered on the positive edges of the clock signal and data is transmitted or received on both the positive and negative clock edges.

The clock input circuitry 22 receives the true clock signal (Clk_t) and the complimentary clock signal (Clk_c) and generates an internal clock signal CLK. The internal clock signal CLK is supplied to an internal clock generator, such as delay locked loop (DLL) circuitry 30. The DLL circuitry 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuitry 30 over the bus 36 to coordinate generation of the phase controlled internal clock signal LCLK. The phase controlled internal clock signal LCLK may be used to clock data through the input/output (IO) interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 26 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface may include command address input circuitry 24 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the IO interface 16. More specifically, the data may be sent to or retrieved from the memory banks 12 over the data path 46, which includes multiple bi-directional data buses. Data IO signals, generally referred to as DQ signals, are generally transmitted and received in one or more bi-directional data buses. The data path 46 may convert the DQ signals from a serial bus 48 to a parallel bus 49.

For certain memory devices, such as a DDR5 SDRAM memory device, the IO signals may be divided into upper and lower bytes. For instance, for a x16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the DQS signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 10, for instance.

The DQS signals are driven by the controller 20 to the memory device 10 to strobe in write data. When the write operation is complete, the controller 20 will stop driving the DQS and allow it to float to an indeterminate tri-state condition. When the DQS signal is no longer driven by the controller 20, the external DQS signal from the controller 20 to the memory device 10 will be at an unknown/indeterminate state. This state can cause undesirable behavior inside the memory device 10 because an internal DQS signal inside the memory device 10 may be at an intermediate level and/or may oscillate. In some embodiments, even the external DQS signal may ring at the I/O interface 16 when the controller 20 stops driving the external DQS signal.

The DDR5 specification may include a short postamble period where the external DQS signal is still driven by the controller 20 after the last write data bit to allow time for disabling of write circuitry to propagate before the controller 20 ceases to drive the external DQS signal. The DDR5 specification may define a short (e.g., 0.5 clock cycle (tCK)) postamble period and a long (e.g., 1.5 tCK) postamble period that may be selected using a mode register. However, the short postamble period may provide a short period of time to reset a DFE buffer.

Returning to FIG. 1, an impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and ground (e.g., low reference voltage for system) voltage (GND, VSS) external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output of the memory device 10. Loopback may include both a data and a strobe or possibly just a data pin. This is generally intended to be used to monitor the data captured by the memory device 10 at the IO interface 16.

As will be appreciated, various other components such as power supply circuitry (for receiving external logical high system voltage (VDD) and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

DDR5 allows write operations to be performed consecutively such that data entry is gapless between two consecutive writes. In this case, the normal postamble for the first write operation and/or the normal preamble for the second write operation may be completely eliminated. For some consecutive write operations, there may be cycle gaps having a certain gap (e.g., 1, 2, 3, or more cycles) between the data burst of the first write operation and the data burst of the second write operation. For these cases, there may be a specified partial postamble and/or partial preamble to support these operations.

In some consecutive write operations, the spacing between the first write operation and the second write operation is such that the entire first postamble and second preamble is met and there may even be additional clock cycles in between the two write operations. When there are additional clock cycles in between the first postamble and second preamble, the DQS strobe may be disabled (float) or driven depending on the specification. Thus, the DFE circuitry 50 may reset the DFE 52 at the end of a write burst using DFE reset circuitry 54 when sufficient time to reset occurs between write operations, but the reset may be at least partially suppressed when there is insufficient time (e.g., less than 2 DQS cycles) between write operations.

The data path 46, the I/O interface 16, and/or the command interface 14 may include a receiver that at least includes decision feedback engine (DFE) circuitry 50. The DFE circuitry 50 may uses a DFE 52 that includes a number (e.g., 4) of taps and phases to latch previous bits (e.g., high or low) that may be used to interpret incoming data bits in data IO signals, generally referred to as DQ signals. The phases (e.g., phase circuitry) may include input buffer circuitry, registers, data latches, NAND gates, NOR gates, AND gates, OR gates, inverter gates, or the like to capture the previous bits and/or generate voltage reference signals to compensate for effects of inter-symbol interference (ISI). The DFE circuitry 50 uses the previous levels in the DQ signals to increase accuracy of interpreting incoming bits in the DQ signals.

For gapless writes or writes spaced with a toggling interamble between the writes due to insufficient time to complete the interamble (e.g., postamble from an earlier write of consecutive writes and a preamble from a later write of the consecutive writes) or a defined toggling, the DFE 52 may continuously update and track every data bit on the channel. For writes spaced far enough apart that have a non-toggling interamble, the DFE 52 will not update during the non-toggling time between writes, and its registers will become invalid for use in collecting the first data bits after the interamble. In some embodiments, the non-toggling interamble may occur when a specified toggling has occurred between writes or may be specified as containing no toggles. In some embodiments, a specification for the memory device 10 may define that a non-toggling interamble is held to a specified value (e.g., data high) so that the channel history can be known by the memory device 10 even though the channel history is not being collected by the memory device 10. The memory device 10 may update the DFE history to the value without data collection during the non-toggling portion of the interamble by using a reset of the DFE 52 to make the registers reset to a specified (e.g., all high data) state.

The DFE circuitry 50 includes DFE reset circuitry 54 to perform the reset of the DFE 52 to known signal values. However, as previously noted, when an insufficient duration for a reset occurs between commands, the DFE circuitry 50 may suppress (e.g., not begin) the reset. Accordingly, the DFE circuitry 50 may selectively perform the DFE reset operation based at least in part on the duration between the commands. Operation of the DFE circuitry 50 may improve when a number of suppressed resets is reduced, thereby permitting more resets to occur. To do so, a length of time used to perform the reset may be reduced when data transaction rates changes to increase a likelihood of the reset fitting within the duration for the reset between commands. When the DFE reset circuitry 54 uses the systems and methods described herein, it may be referred to as a variable reset circuitry. Indeed, using variable reset circuitry as the DFE reset circuitry 54 may enable reset logic of the DFE reset circuitry 54 to change a reset frequency between sequential data bursts or based on one or more properties of the memory device 10, such as by increasing a frequency of DFE resets based on the spacing between write bursts from the controller 20.

Figure 2:
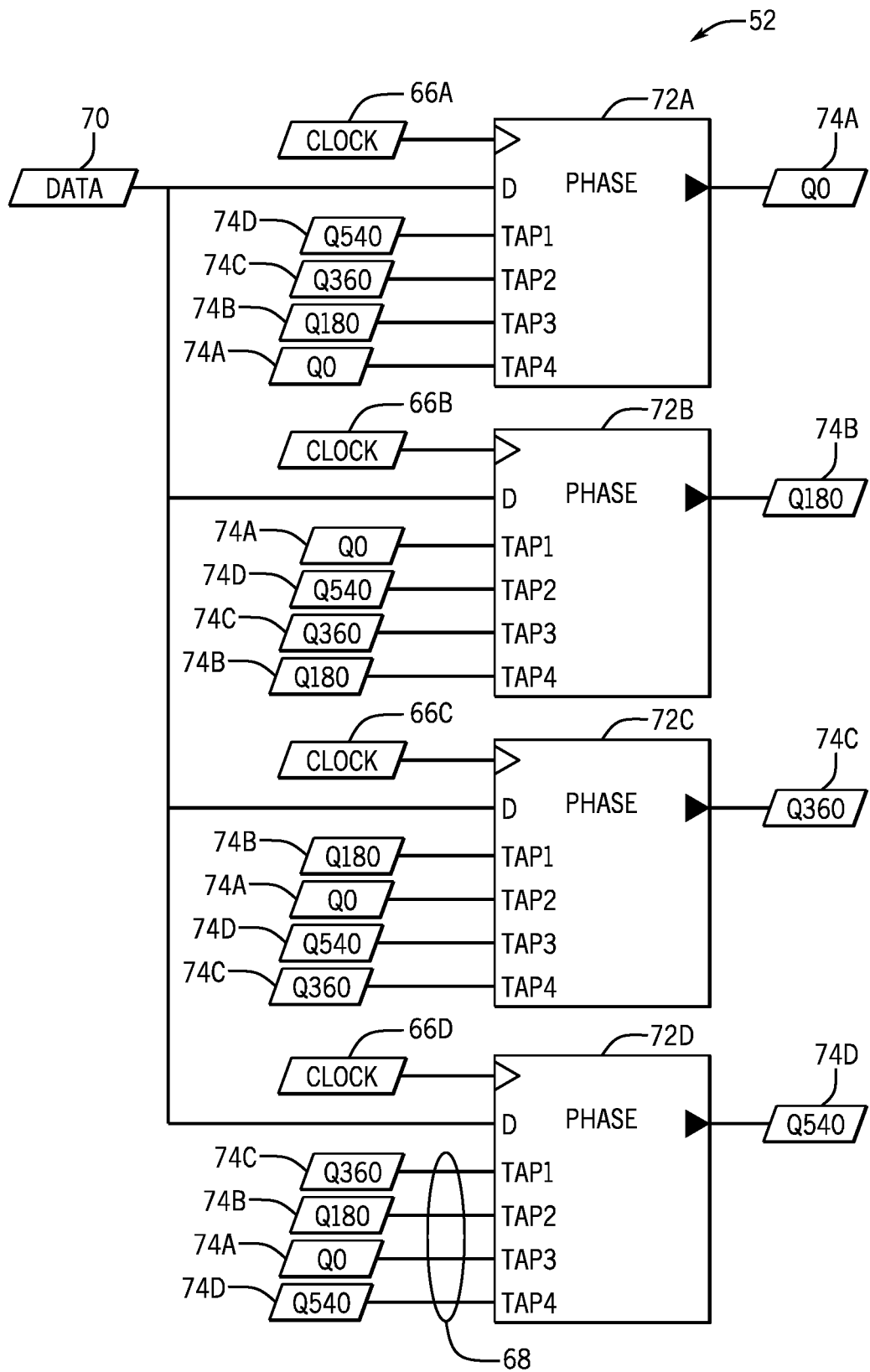
FIG. 2 is a simplified block diagram illustrating the DFE of FIG. 1 including multiple phases and taps, in accordance with an embodiment.

To elaborate, FIG. 2 is a block diagram of the DFE 52. The DFE 52 includes four phases 72 in receiver circuitry of the data path 46. The DFE 52 receives data 70 to be transmitted via the data path 46 and each phase 72 may include input buffer circuitry (not illustrated). The four phases 72 of the DFE 52 receive voltages indicative of previously transmitted bits (e.g., data 74 feedback at taps 68), which are used as to adjust a received system reference voltage (not illustrated). It is noted that the data 70 may be transmitted on one or more electrical connections to each of the phases 72. However, each phase 72 may process data relatively offset in time, such that receiving of data 70 and outputting of data 74 for one phase 72 is staggered by a particular time duration relative to the other phases 72. In this way, each of the data 74 may not output at a same time and are staggered based on the particular time duration. Thus, each phase 72 may receive respective clock signals 66 offset in time relative to each other. For example, a first transition of the clock signal 66A may lead a first transition of the clock signal 66B by 180 degrees (°), the first transition of the clock signal 66B may lead a first transition of the clock signal 66C 180°, the first transition of the clock signal 66C may lead a first transition of the clock signal 66D by 180°, and the first transition of the clock signal 66D may lead a second transition of the clock signal 66A by 180° but may lag the first transition of the clock signal 66A by 540°. Data 74 outputs may be delayed or offset relative to each other based on the timings of the respective clock signals 66, as indicated on notation of FIG. 2 for respective data 74 (e.g., "Q0," "Q180," "Q360," "Q540"). The data 70 may transmit as binary data, bit-by-bit to each phase 72. And thus, using phase 72D as an example, binary data corresponding to a first transition of clock 66D to the D phase 72D may output as data 74D and be offset in time by 540° relative to the data 74A. Similar offset timing applies to the other phases 72 to generate adjusted data 74A, 74B, 74C, and 74D over time. Although 180° differences are described herein, it should be understood that any amount of delay between clocking signals and/or data outputs may be used.

To do so, each phase 72 uses the taps 68 each receiving data 74 feedback to adjust a reference voltages used to compare an incoming bit (e.g., incoming data 70) against. It is noted that this is just one example of a DFE circuit, and that other DFE circuitry that also adjust for ISI may be used in combination or alternatively with the variable reset systems and methods described herein. Adjusting the reference voltages may equalize inputs to the data path 46, reducing distortion that ISI causes to the incoming bit. By compensating for ISI distortions, receiver performance may improve (e.g., distortion is reduced or eliminated). Since the DFE 52 includes four phases, a first phase 72A, second phase 72B, third phase 72C, and a fourth phase 72D, each receiving four bits of data feedback via respective taps 68, four bits of ISI may be compensated. More or less taps 68 and phases 72 may be included in the DFE 52 based on a number of bits of distortion desired to be corrected. An equal number of taps and phases 72 may be used. Each phase 72A-D latches (e.g., stores) one or more indications of previous bits transmitted via data path 46.

The DFE 52 includes four phases 72 that each use fed back bit values (e.g., output data 74 feedback) to adjust for ISI from previously transmitted bits that may distort presently transmitted bits of data 70. The four phases 72 may correspond to receiver circuitry of the memory device 10 and thus operate based on presently transmitted data (e.g., phase data 70) to perform the ISI adjustments. For example, a D phase data 70 corresponding to the fourth phase 72D is latched using a reference voltage adjusted based on data captured for other previously transmitted (e.g., data 74A previously transmitted via the first phase 72A, data 74B previously transmitted via the second phase 72B, data 74C previously transmitted via the third phase 72C, and data 74D previously transmitted via the fourth phase 72D). A respective input to one of the phases 72 are referred to herein as a respective tap of the taps 68. Each phase 72 may include summation circuitry, and thus each of the feedback signals from the other phases 72 may feed into the summation circuitry to adjust respective reference voltage values used to compare an incoming bit (e.g., incoming phase data 70) to the respective tap when latching the logical value of the bit. For example, a reference voltage may have a voltage value of 0.5 volts (v) and be used to determine whether a bit of the incoming data 70 is to be latched as a 0 bit or a 1 bit (e.g., 0 when below 0.5 v or 1 when above 0.5 v). However, that reference voltage value of 0.5 v may produce less accurate results than when adjusted to compensate for ISI effects on transmitted data values. Each phase 72 may adjust its respective reference voltage based on data 74 received at its taps 68 to compensate for ISI, and thus respective reference voltages used by each phase 72 may be a same voltage or different voltage value based at least in part on the specific combination of previously transmitted data feedback signals. Each phase 72 may operate based on timing of its respectively received clock signal 66.

Phases 72 or other associated circuitry of the DFE circuitry 50 may be reset when a continuous stream of data stops, such as in response to clocking (e.g., data strobe) signals stopping or pausing transmission to the DFE 52. Variable reset systems and methods may pause or stop a clocking signal transmission to control timing of a reset, and thus to improve operation of the memory device 10.

Figure 6:
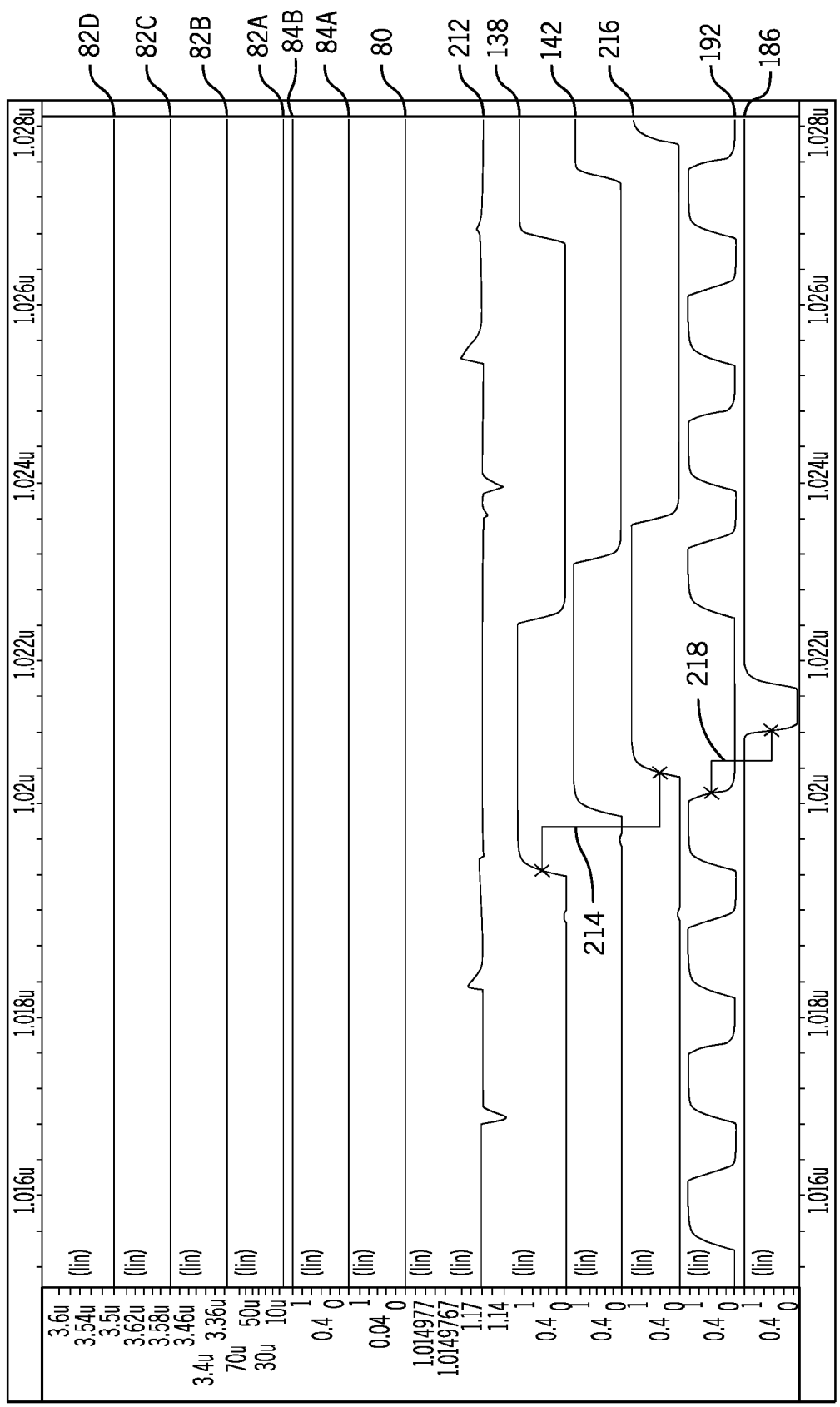
FIG. 6 is a timing diagram that may be used by the memory device of FIG. 1 showing the DFE reset signals from the DFE reset generator according to a first rate, in accordance with an embodiment.
Figure 7:
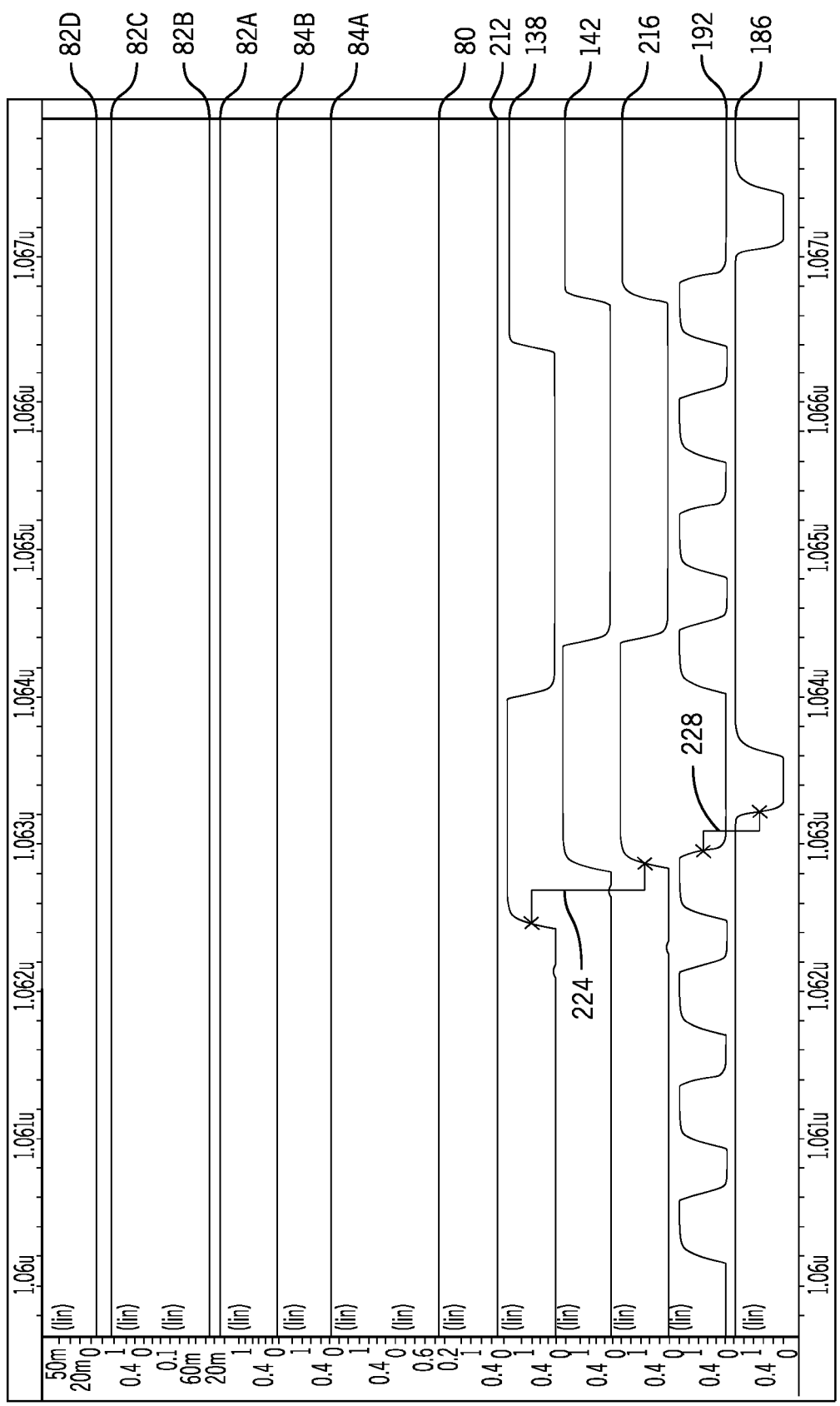
FIG. 7 is a timing diagram that may be used by the memory device of FIG. 1 showing the DFE reset signals from the DFE reset generator according to a second rate, in accordance with an embodiment.

To elaborate, when resetting the feedback values captured by each phase 72 for the previously transmitted bits, care is to be taken. Resetting too fast may reset captured values too early, affecting the bit history of downstream taps 68 and/or phases 72, and thus may impact downstream adjustments (e.g., such as in the case of the feedback data from the first phase 72A being used by the fourth phase 72D). Resetting too slow may not leave enough time to complete the reset and cause similar adjustment issues. As transaction rates decrease, a delay between a time corresponding to when a last bit is captured by a phase 72 and a time corresponding to a start of the DFE reset may also decrease. Changes from transaction rate changes may similarly affect the DFE reset duration, which is fit into the time duration following the time corresponding to when the last bit is captured by the phase 72 (as illustrated in FIGS. 6 and 7). As transaction rates increase, the reset duration (e.g., period of time during which the reset is performed) can compress (e.g., shortens in time and increasing in rate). Conversely, as transaction rates decrease, the reset duration may increase (e.g., lengthens in time and reduces in rate). Circuitry shown in FIGS. 3-5 may enable the DFE reset timing to vary, thereby permitting a suitable amount of time for the reset. That is, the DFE reset timing may be varied an amount of time suitable to not interrupt any ongoing adjustment operations of downstream phases.

It is noted that throughout this disclosure certain logic gates are described. It should be understood that the described logic gates operate to generate outputs according to truth tables, as one of skill in the art would be familiar with. For example, each not-AND gate may operate to generate an output according to Table 1 and each not-OR gate may operate to generate an output according to Table 2.

TABLE 1

| Input A | Input B | Output (A NAND B) |
|---------|---------|-------------------|
| 0 | 0 | 1 |
| 0 | 1 | 1 |
| 1 | 0 | 1 |
| 1 | 1 | 0 |

TABLE 2

| Input A | Input B | Output (A NOR B) |
|---------|---------|------------------|
| 0 | 0 | 1 |
| 0 | 1 | 0 |
| 1 | 0 | 0 |
| 1 | 1 | 0 |

Figure 3:
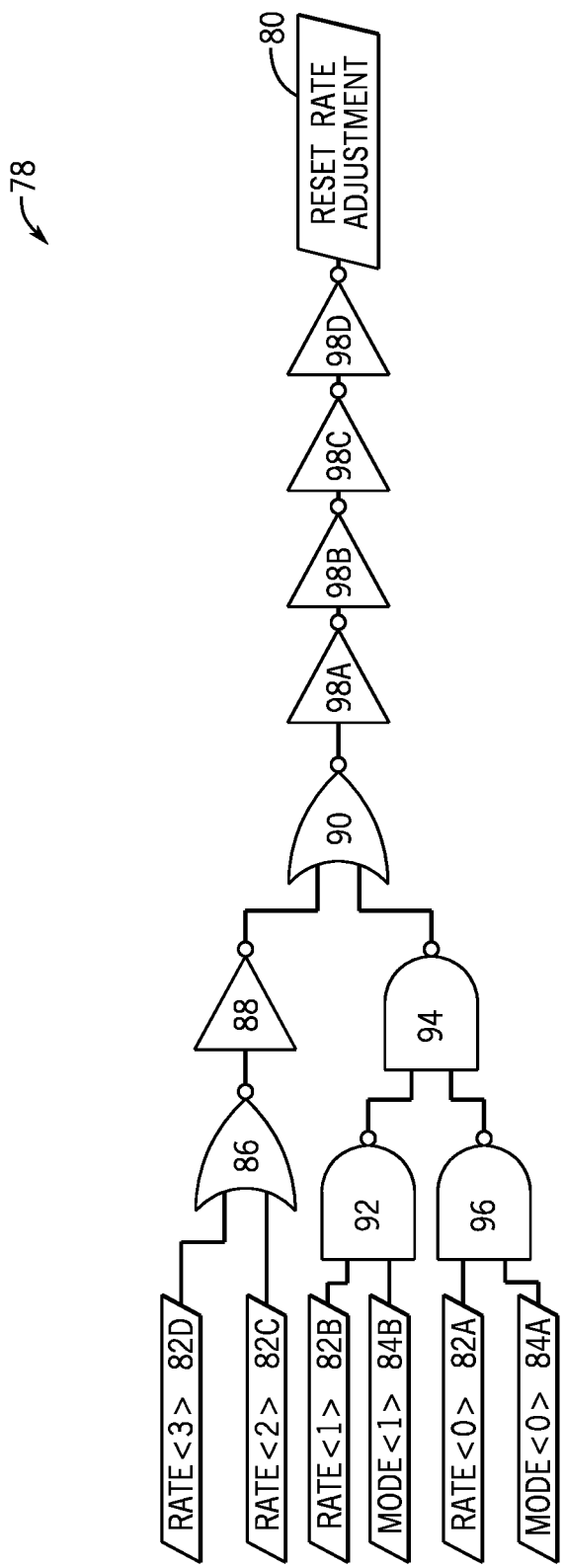
FIG. 3 is a schematic diagram of reset rate control circuitry of the DFE reset circuitry of FIG. 1, in accordance with an embodiment.

FIG. 3 is a schematic diagram of reset rate control circuitry 78 of the reset circuitry 54. The reset rate control circuitry 78 includes combinational logic circuitry able to receive control signals from a mode register, storage, cache memory, fuses, the controller 20, or the like, to adjust a DFE reset through generation of a DFE reset rate adjustment signal 80 (e.g., reset rate adjustment signal 80). Thus, although certain combinations of logic circuitry are described and shown herein, it should be understood that many combinations of combinational logic maybe arranged to operate to adjust a DFE reset, and the arrangement described herein may be one efficient arrangement that uses relatively few amounts of logic to provide variable DFE resets. The reset rate control circuitry 78 includes multiple interconnected logic gates and generates a reset rate adjustment signal 80 based on a combination of register values and fuse states. Since signals received by the reset rate control circuitry 78 may change, the characteristics of the reset rate adjustment signal 80 may change and may cause changing of a reset frequency of the DFE 52 downstream. For example, rate control signals 82 (82A, 82B, 82C, 82D) may be read from a mode register (not illustrated) and mode control signals 84 (84A, 84B) may be generated based on or read from one or more fuse states. The mode control signals 84 indicate whether one or more fuses are burned (e.g., highly resistive) or not burned (e.g., conductive) via respective voltage values. The mode register may be disposed external to the reset circuitry 54 and/or the reset rate control circuitry 78, communicatively coupled to the reset circuitry 54 and/or the reset rate control circuitry 78, or the like. In some cases, the reset rate control circuitry 78 may receive control signals directly as opposed to receiving signals from a mode register and/or fuses. These control signals may identify an operational reset mode to use from two or more operational reset modes with each corresponding to a different reset frequencies suitable for different operational frequencies of the memory device 10. In FIG. 3, the control signals indicate whether to use one of two reset frequencies of the memory device 10.

The combination of the rate control signals 82 and the mode control signals 84 indicate the timing of a potential reset (e.g., a slow reset timing for decreased transaction rates or a fast reset timing for increased transaction rates). Values of these signals may be changed on a per-part (e.g., per memory device 10) basis based on the part's respective process-voltage-temperature (PVT) performance determined from sensing data, for example, obtained during diagnostic testing or the like. Different memory devices 10 may have different speed grades, and during manufacturing the various memory devices 10 may be graded to identify which speed grade they are to be assigned. A relatively faster speed grade part may still be used at slower data rates by the memory device 10. A speed grade of a current use condition (e.g., speeds of current operations) may be stored in the mode register and values stored in the mode register may control a reset rate of the DFE 52, permitting the reset rate of the DFE 52 to adjust with changes to operating speeds and/or operational condition. Thus, the rate control signals 82 enable control of the reset rate based on an indication of a speed grade that causes generation of the reset rate adjustment signal 80. The slower rate mode may be activated when the reset rate adjustment signal 80 is generated having a voltage corresponding to a logic high state. In devices where more than two rate modes (e.g., slower rate mode and higher rate mode) are used, additional voltage levels and/or logic circuitry outputs may be used to determine the rate mode corresponding to the grade indicated via the mode register.

For example, when rate control signals 82A-D are each stored as logical low values in the mode register and when the mode control signals 84A and 84B are both logical high values from the fuse states, the slower rate mode is activated. This slower rate mode is shown in FIG. 6, as will be appreciated.

To generate the reset rate adjustment signal 80, rate control signals 82 are received at the reset rate control circuitry 78. The rate control signals 82 may be sequentially received after being read one by one from the mode register or may be received at a substantially similar time in parallel. Similarly, the mode control signals 84 may be received sequentially or in parallel after being read one by one from the fuse states.

At not-OR (NOR) gate 86, the rate control signal 82D is compared with the rate control signal 82C. The output from the NOR gate 86 is inverted by inverter 88 and transmitted to NOR gate 90 as an input.

At not-AND (NAND) gate 92, the rate control signal 82B is compared with the mode control signal 84B. The output from the NAND gate 92 is transmitted to NAND gate 94 as an input. NAND gate 94 also receives the output from NAND gate 96 as an input. NAND gate 96 generates its output based on inputs of the rate control signal 82A and the mode control signal 84A.

At NOR gate 90, the output from NAND gate 94 and the inverter 88 are compared and the output from the NOR gate 90 is transmitted through sequentially coupled inverters 98 (98A, 98B, 98C, 98D). Transmitting the output through the inverters 98 may delay transmission of the output, such as to align timing of transmission of the output with another signal transmission, while also helping to preserve signal integrity of the signal. The output transmits to downstream circuitry as the reset rate adjustment signal 80.

Figure 4:
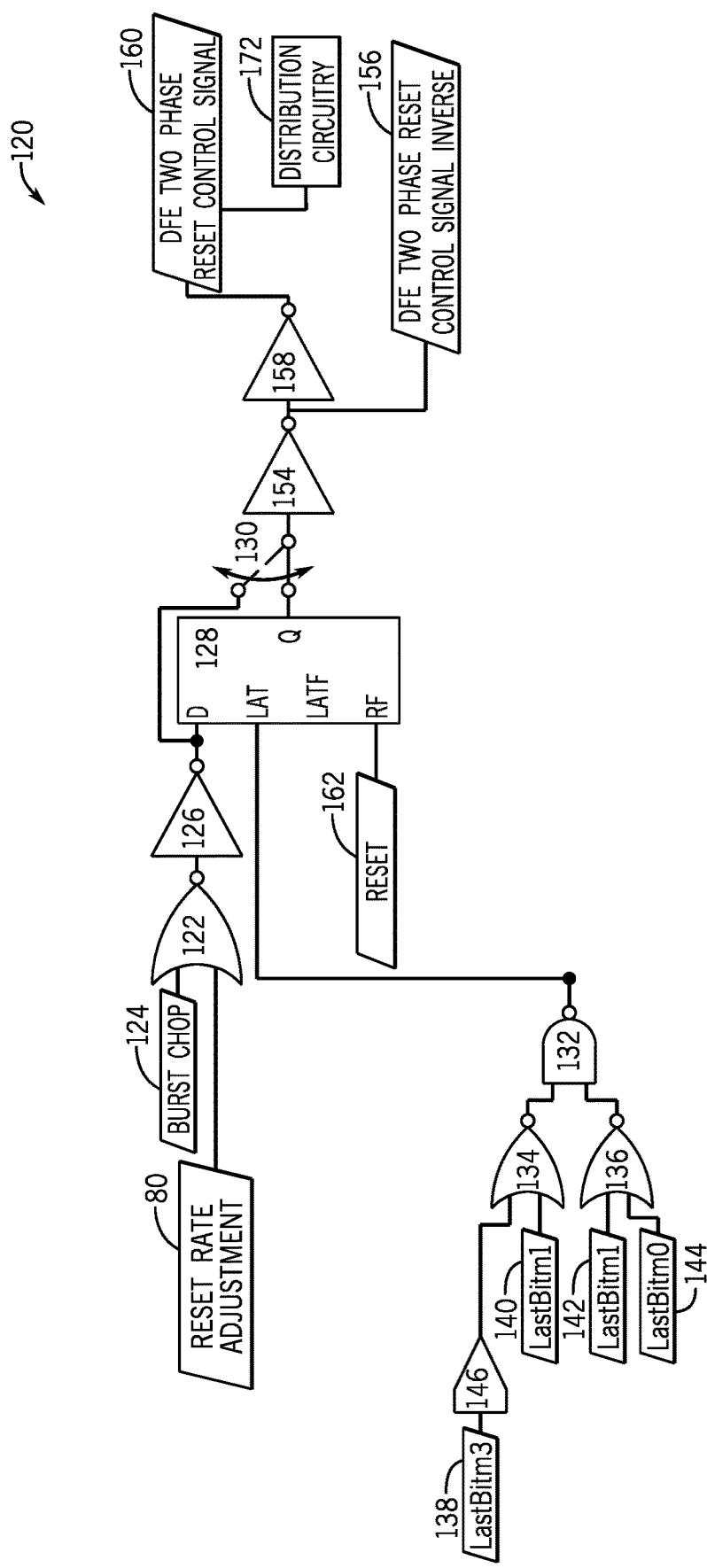
FIG. 4 is a schematic diagram of a signal generator of the DFE reset circuitry of FIG. 1 that generates timing signals for the DFE reset, in accordance with an embodiment.

FIG. 4 is a schematic diagram of a signal generator 120 (e.g., a DFE reset signal generator) of the DFE circuitry 50 that generates timing signals for the DFE reset operation. The signal generator 120 receives the reset rate adjustment signal 80 from the reset rate control circuitry 78 at NOR gate 122. When the reset rate adjustment signal 80 corresponds to a logical high state (e.g., is characterized by a voltage corresponding to a logical high state), NOR gate 122 outputs a signal corresponding to a logical low state (e.g., is characterized by a voltage corresponding to a logical low state). In some cases, a burst chop signal 124 is also input to the NOR gate 122. The NOR gate 122 outputs a signal corresponding to a logical low state when either or both inputs to the NOR gate 122 are signals corresponding to logical high states. When both inputs are signals corresponding to logical low states, the NOR gate 122 outputs a signal corresponding to a logical high state. The output from the NOR gate 122 is inverted by inverter 126 and latched by latch 128. The latch 128 stores a value of the "D" input in response to the rising edge of an output from NAND gate 132 received at the "LAT" input. In some cases, the controller 20 and/or the DFE reset circuitry 54 may operate a switch 130 to cause the output from the inverter 126 to bypass the latch 128. Bypassing the latch 128 may be desired when testing the memory device 10 (i.e., while in a test operational mode), however, other operations may also use this latch 128 bypassing state.

The output from the NAND gate 132 is generated in response to outputs from NOR gate 134 and NOR gate 136. The NOR gate 134 generates an output in response to a last bit minus three clock cycles (LASTBITM3) signal 138 and a last bit minus two clock cycles (LASTBITM2) signal 140. The NOR gate 136 generates an output in response to a last bit minus one clock cycles (LASTBITM1) signal 142 and a last bit minus zero clock cycles signal (LASTBITM0) 144. The LASTBITM0 signal 144 is the last bit minus zero cycles, the LASTBITM1 signal 142 is the last bit minus one cycle, the LASTBITM2 signal 140 is the last bit minus two clock cycles, and the LASTBITM3 138 is the last bit minus three clock cycles. It is noted that each of the LASTBITM3 signal 138, the LASTBITM2 signal 140, the LASTBITM1 signal 142, and the LASTBITM0 signal 144 may be delayed by a number of clock cycles by upstream delay circuitry. It is noted that the LASTBITM3 signal 138 may be additionally delayed by a delay gate 146 (e.g., delay block). Furthermore, it is also note that additional combinational circuitry may be used to further alter the DFE reset timing and/or other characteristics of the DFE reset operation, and that these variable reset timing adjustment systems and methods may be combined with other DFE reset systems and methods.

The output from the latch 128 may be inverted by inverter 154 for output as an DFE two phase reset control signal inverse 156. The output from the inverter 154 may be inverted again by inverter 158 for output as a DFE two phase reset control signal 160 (e.g., inverse of output from inverter 154, inverse of the DFE two phase reset control signal inverse 156). The DFE two phase reset control signal 160 is transmitted from the signal generator 120 to distribution circuitry 172 of FIG. 5. The DFE two phase reset control signal 160 may transmit for a duration of time correspond to a transmission time of the LASTBITM3 signal 138 until a transmission time of the LASTBITM0 signal 144.

When the slower reset mode is to be used, the reset rate adjustment signal 80 has a logical high value when latched or stored, causing a DFE two phase reset control signal 160 having a logical high signal to output from inverter 158. Thus, the DFE two phase reset control signal 160 having a logical high signal causes downstream circuitry to use the slower reset mode. For example, distribution circuitry 172 may receive the DFE two phase reset control signal 160 and interpret the DFE two phase reset control signal 160 having a logical high state as indicating the slower reset mode, and therefore starting a slower reset operation via its generation of a reset toggle signal (shown in FIG. 5).

In this example, the slower reset operation (e.g., a first reset mode) enabled via the reset rate adjustment signal 80 being a logical high voltage, is slower than a normal reset mode (e.g., a second reset mode) by one clock cycle. The delay or advancement of the particular reset mode may be programmable based on, for example, a number of latches, logic gates, inverters, or the like used to distribute a signal indicating a reset mode and the input buffer being reset. Thus, any suitable amount of delay or advancement may be applied using these systems and methods. It is also noted that the latch 128 may be reset using reset signal 162 when desired by the controller 20, such as after generating the DFE two phase reset control signal 160, per other system operations.

Figure 5:
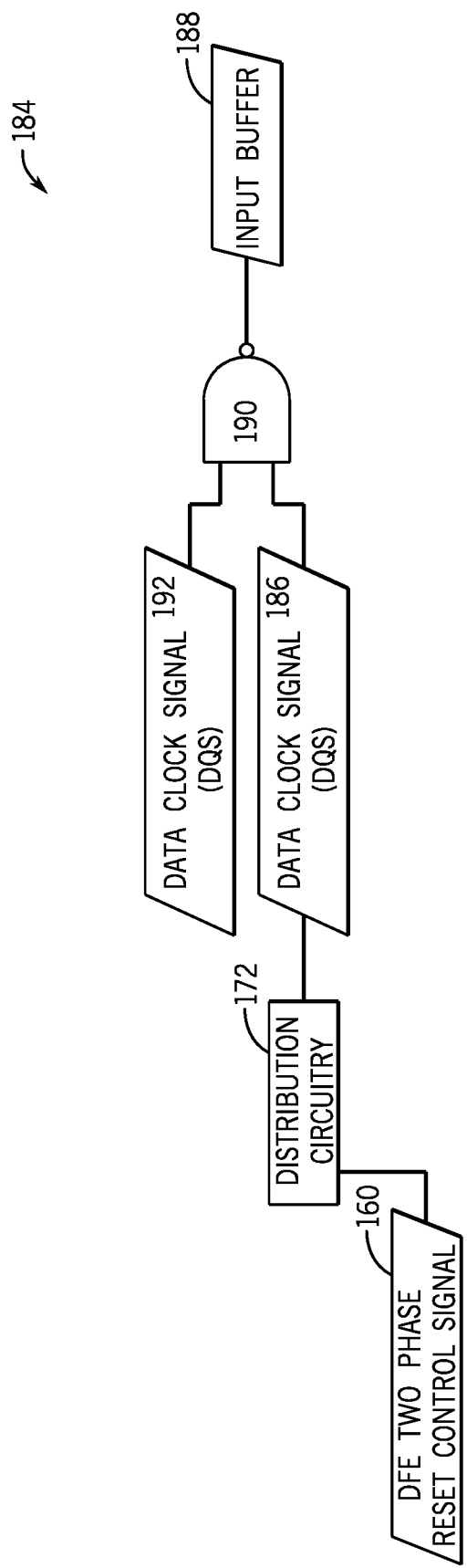
FIG. 5 is a schematic diagram of toggle circuitry of the DFE reset circuitry of FIG. 1, in accordance with an embodiment.

FIG. 5 is a partial schematic diagram of toggle circuitry 184 of the DFE circuitry 50 that initiates or helps to initiates the DFE reset operation in response to a reset toggle signal 186 from the distribution circuitry 172. The toggle circuitry 184 receives the DFE two phase reset control signal 160 from the signal generator 120 at the distribution circuitry 172, which modifies the DFE two phase reset control signal 160 to generate a reset toggle signal 186. The DFE two phase reset control signal 160 causes the distribution circuitry 172 to pulse the reset toggle signal 186 low between write commands, starting the DFE reset operation via an input buffer 188. Although the input buffer 188 is shown as one input buffer, it should be understood that the input buffer 188 may be representative of one or more input buffers associated with one or more DFEs 52.

While the reset toggle signal 186 has a logical low voltage value, the output from NAND gate 190 has a logical high voltage output. Indeed, while the NAND gate 190 receives a logic low voltage as the reset toggle signal 186, the output from the NAND gate 190 does not toggle with changes in voltage value transmitted as a data clock signal (DQS) 192. It is noted that the DQS 192 may be related to clock signals 66 of FIG. 2 and/or be derived from a same original clocking signal or source. The logical high voltage output to the input buffer 188 triggers the reset of one or more data latches of the DFE 52 via the input buffer 188, and thus of the DFE circuitry 50. In this way, one or more signals output from the NAND gate 190 start or cause the reset of the voltages of the bit feedback latched or stored by the phases 72. FIG. 6 and FIG. 7 illustrate signals used to provide two reset modes, as discussed herein.

FIG. 6 is a timing diagram of signals associated with the slower reset mode corresponding to the reset rate adjustment signal 80 having the logical high value. Indeed, the timing diagram shows that the reset rate adjustment signal 80 has a logical high voltage value, and this logical high voltage value results from the combination of states of input signals to the reset rate control circuitry 78. In particular, rate control signals 82A-D each have a logical low voltage value and mode control signals 84A and B both have logical high voltage values. The timing diagram also includes a signal 212 representative of the "D" input to latch 128. These inputs trigger the input buffer 188 to reset in response to a rising edge of the LASTBITM3 signal 138. In this example, the time difference (e.g., time duration 214) between the LASTBITM3 signal 138 and signal 216 is 968 picoseconds (ps) and the time difference (e.g., time duration 218) between the last falling edge of the DQS 192 before falling edge (e.g., toggle) in the reset toggle signal 186 to trigger the reset of the input buffer 188 is 557 ps. Comparing this timing to timing illustrated in FIG. 7 highlights the change in reset timing enabled by the changing in reset modes.

FIG. 7 is a timing diagram of signals associated with the faster, normal reset mode corresponding to the reset rate adjustment signal 80 having the logical low value. In this case, the time difference (e.g., time duration 224) between the LASTBITM3 signal 138 and the signal 216 is 427 ps and the time difference (e.g., time duration 228) between the last falling edge of the DQS 192 before the falling edge (e.g., toggle) in the reset toggle signal 186 to trigger the reset of the input buffer 188 is 225 ps. This depicted reset mode is a faster reset mode than that shown in FIG. 6 since the time duration 218 is about 50% the length of time duration 228 (e.g., 332 ps difference).

By using systems and methods described herein, a memory controller 20 may selectively shift or slow (e.g., delay) a reset interval. For example, when the reset operation timing is relatively delayed from desired timing, the controller 20 may change values stored in the mode register to speed up the reset interval, thereby aligning the reset interval over time. This may be of particular use in devices that experience reset interval shifting when left unadjusted. By eliminating or reducing a likelihood of reset interval shifting, accuracy of DFE compensation operations may improve by reducing how frequent reset operations prematurely clear latched feedback data of the phases 72.

It should be understood that more or less circuitry could be included in any of the figures, including, for example, the distribution circuitry 172 and the input buffer 188. Furthermore, additional circuitry may be included to perform the reset of the DFE circuitry 50 beyond the NAND gate 190 to change (or toggle) its output based on the DQS signal 192 and the reset toggle signal 186.

As discussed above, the rate control signals 82 and the mode control signals 84 may be generated from values stored in one or more mode registers. It should be appreciated that other methods or systems may be used to communicate similarly applied settings to the memory device 10 described herein. For example, an input may provide the rate control signals 82 and/or the mode control signals 84 in place of or bypassing the mode registers, such as an input from an input device (e.g., keyboard, mouse, touch screen, sensing device) or a feedback control loop. In some cases, the inputs may be used to program the mode registers, and thus the resetting may be based on both an input signal from an input device and/or feedback loop and a mode register. The described resetting operations may also be performed in combination with starting the clock earlier to compensate for an asynchronous flight time.

Furthermore, in some cases, the DFE reset circuitry may be centralized rather than distributed within each data (DQ) line in a parallelizer. Using the centralized DFE reset circuitry, a DFE reset operation may be initiated centrally for a number of bits (e.g., once per byte) to save power and die size consumed by the DFE reset circuitry over memory devices that utilize localized DFE reset generators in multiple phases of multiple DQs. In this way, signals generated to transmit the reset toggle signal 186 may also be used to selectively reset multiple, separate DFE circuitry using the shared signals. These systems and methods for performing variable speed reset operations may be used in combination with centralized DFE reset circuitry.

Some devices may use the reset rate control circuitry 78 and the reset rate adjustment signal 80 in combination with data strobe counter (DQS counter) circuitry and/or the distribution circuitry 172. For example, the DQS counter counts cycles (clock cycles) between data bursts or commands and thus be used to trigger transmission of the reset toggle signal 186 from the distribution circuitry 172.

Although the foregoing discusses various logic-low and/or logic-high assertion polarities, at least some of these polarities may be inverted in some embodiments. Furthermore, in some embodiments, logic gates discussed herein may be replaced with similar logical functions, such as an inverter replaced with a single NAND gate or other similar changes.

Technical effects include systems and methods to vary a start time of a DFE reset operation to occur between write command bursts. Varying timing associated with the DFE reset operation may help a controller delay or advance the reset operation to align better with desired timing. Inclusion of the reset rate control circuitry and the additional logic gates to the signal generation circuitry to receive output signals from the reset rate control circuitry may also enable a wider operating frequency range than a singularly timed DFE reset pulse. Indeed, unlike a singularly timed DFE reset pulse that limits operation of the DFE to one operating frequency (e.g., either limits to a relatively fast operating frequency or a relatively slow operating frequency without ability to switch between the two modes), the systems and methods described herein enable the DFE reset pulse to be programmable. The timing of the DFE reset pulse may be programmed via the mode register (or with direct control signals) based on speed grading of silicon performance of the memory device. Indeed, by changing the values stored in the mode register, the DFE reset pulse may be varied based on DFE input tap settings, write preamble settings, write burst length, silicon anti-fuse programming, speed grade programming, or the like.

These systems and methods described herein may enable launching a DFE reset operation off an earlier clock (e.g., a time shifted four-phase reset) to verify that the DFE reset is properly timed at faster speed grades of memory devices than what would be supported with the four-phase reset (e.g., faster reset represented by FIG. 7). Furthermore, the DFE reset pulse may be further shifted or manipulated based on DFE input tap settings, write preamble settings, write burst length, silicon anti-fuse programming, speed grade programming, or the like, such as to vary time shifted four-phase reset timings, non-time shifted four-phase reset timings, two-phase reset timings, single-phase reset timings, or the like.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device, comprising:
an input buffer configured to store one or more indications of previous bits transmitted via a data path; and
decision feedback equalizer (DFE) circuitry comprising:
reset rate control circuitry configured to generate a DFE reset rate adjustment signal; and
a signal generator configured to:
receive timing signals and the DFE reset rate adjustment signal; and
transmit a control signal to the input buffer, wherein the control signal is generated in response to the timing signals and the DFE reset rate adjustment signal, and wherein the control signal is configured to adjust a timing of a DFE reset operation used to reset the one or more indications of previous bits.

2. The memory device of claim 1, wherein the reset rate control circuitry is configured to generate the timing signals based at least in part on one or more rate signals read from a mode register, one or more mode signals read from one or more fuses, or both.

3. The memory device of claim 1, wherein the reset rate control circuitry is configured to generate the timing signals based at least in part on control signals indicative of an operational reset mode.

4. The memory device of claim 1, wherein the signal generator is configured to transmit the control signal to the input buffer in response to data corresponding to a last bit minus three clock cycles (LASTBITM3).

5. The memory device of claim 4, wherein the signal generator comprises a latch, and wherein the data corresponding to the last bit minus three clock cycles (LASTBITM3) is transmitted via a delay gate to further delay the data before being received by the latch that generates the control signal.

6. The memory device of claim 5, wherein the signal generator is configured to continue transmitting the control signal to the input buffer until data corresponding to the last bit minus zero clock cycles (LASTBITM0) is received by the latch.

7. The memory device of claim 1, wherein the control signal is configured to adjust the timing of the DFE reset operation between a plurality of frequency operations.

8. The memory device of claim 7, wherein:
the control signal:
when characterized by a first voltage, causes adjustment of the timing of the DFE reset operation to a first frequency, and
when characterized by a second voltage, causes adjustment of the timing of the DFE reset operation to a second frequency; and
the first frequency is less than the second frequency.

9. The memory device of claim 1, comprising distribution circuitry coupled between the input buffer and the signal generator, wherein the distribution circuitry generates a reset toggle signal based at least in part on the control signal, and wherein the reset toggle signal is configured to change operation of the input buffer to initiate the DFE reset operation.

10. A device comprising:
a plurality of phases configured to receive bit feedback at respective inputs of the plurality of phases; and
variable reset circuitry configured to reset voltages of the bit feedback at inputs of each respective phase of the plurality of phases between a first data burst and a second data burst, wherein the variable reset circuitry is configured to change its reset frequency between sequential data bursts.

11. The device of claim 10, wherein:
at a first time before the first data burst, the variable reset circuitry is configured to use a first reset frequency; and
at a second time after the first data burst, the variable reset circuitry is configured to use a second reset frequency.

12. The device of claim 11, comprising control circuitry to generate one or more control signals used to change an operation of the variable reset circuitry between the first reset frequency and the second reset frequency, wherein the plurality of phases comprises four phases configured to compensate for four bits of inter-symbol interference.

13. The device of claim 12, wherein the control circuitry is configured to change the operation of the variable reset circuitry based at least in part on write preamble settings, write burst length, silicon anti-fuse programming, speed grade programming, direct control signals, or any combination thereof.

14. The device of claim 10, wherein the first data burst corresponds to a first write command and the second data burst corresponds to a second write command.

15. The device of claim 10, wherein the variable reset circuitry comprises a not-AND (NAND) gate configured to receive a reset toggle signal, a data strobe signal (DQS), or both, and wherein an output from the NAND gate starts the reset of the voltages of the bit feedback.

16. A method, comprising:
generating a decision feedback equalizer (DFE) reset rate adjustment signal at reset rate control circuitry, wherein the reset rate control circuitry generates the DFE reset rate adjustment signal based at least in part on rate control signals indicative of a frequency to use during a DFE reset operation;
generating timing signals based at least in part on data transmitted to DFE circuitry;
transmitting the DFE reset rate adjustment signal and the timing signals to a signal generator;
using the signal generator, generating a reset control signal for the DFE circuitry of a memory device; and
selectively resetting phases of the DFE circuitry using the reset control signal to perform the DFE reset operation.

17. The method of claim 16, comprising accessing a mode register to obtain the rate control signals.

18. The method of claim 16, comprising generating the DFE reset rate adjustment signal based at least in part on a mode control signal generated in response to a fuse state.

19. The method of claim 16, comprising selectively resetting a plurality of DFE circuitry including the DFE circuitry using the reset control signal.

20. The method of claim 16, comprising:
generating another DFE reset rate adjustment signal at the reset rate control circuitry at a later time using different rate control signals, wherein the use of the different rate control signals changes a frequency used to reset the phases of the DFE circuitry.

* * * * *